United States Patent [19]

Axenov et al.

[11] 4,452,686

[45] Jun. 5, 1984

[54] ARC PLASMA GENERATOR AND A PLASMA ARC APPARATUS FOR TREATING THE SURFACES OF WORK-PIECES, INCORPORATING THE SAME ARC PLASMA GENERATOR

[76] Inventors: Ivan I. Axenov, ulitsa Valtera, 21-a, kv. 45; Vitaly A. Belous, ulitsa Svetlaya, 21, kv. 250; Valentin G. Padalka, ulitsa Danilevskogo, 10, kv. 122; Vladimir M. Khoroshikh, prospekt 50-letia VLKSM, 42, kv. 128, all of Kharkov, U.S.S.R.

[21] Appl. No.: 360,447

[22] Filed: Mar. 22, 1982

[51] Int. Cl.$^3$ .................... C23C 15/00; C23C 13/08
[52] U.S. Cl. .................... 204/298; 118/50.1; 118/723; 118/728; 204/192 R; 219/76.16; 219/121 PL; 313/160
[58] Field of Search .................... 204/164, 192 C, 298; 118/50.1, 723, 728; 427/37, 47; 219/76.16, 121 PL, 121 PV; 313/160, 161; 315/338, 344; 422/186.21, 186.28

[56] References Cited

U.S. PATENT DOCUMENTS 3,904,505  9/1975  Aisenberg ........................... 204/298
4,321,126  3/1982  Kieferle et al. ...................... 204/298

OTHER PUBLICATIONS

P. C. Karr, Vacuum Deposition of Material Films . . . , *IBM Technical Disclosure Bulletin*, vol. 19, No. 5, Oct. 1976, pp. 1518–1520.
Article "Pulsed Metallic–Plasma Generators", by Alexander S. Gilmour, Jr. and David L. Lockwood, Proceedings of the IEEE, vol. 60, No. 8, Aug. 1972.

*Primary Examiner*—G. L. Kaplan
*Assistant Examiner*—William Leader
*Attorney, Agent, or Firm*—Fleit, Jacobson, Cohn & Price

[57] ABSTRACT

An arc plasma generator comprises a consumable cathode, a cylindrical anode, and a focusing solenoid arranged coaxially with the consumable cathode. A power unit for maintaining the arc is electrically connected to the consumable cathode and the anode. In accordance with the invention the arc plasma generator further comprises a tubular plasma guide connected to an end face of the anode and an electromagnet. The electromagnet is arranged in the tubular plasma guide on the axis thereof and is enclosed in a housing made of a nonmagnetic material and having a cross-sectional area sufficient to conceal the cathode from the viewer's sight, looking in the direction of the cathode through the plasma guide. Also, the focusing solenoid is arranged on the tubular plasma guide and is connected in opposition with the coil of the electromagnet. A plasma arc apparatus for treating the surfaces of work-pieces comprises an arc plasma generator of the invention and an assembly for holding the work-piece to be treated. The assembly is a cover having a centrally-disposed opening. The cover is fixed on the end face of the plasma guide. The apparatus is also provided with a disk coil attached to the cover and connected in an aiding manner with the focusing solenoid.

7 Claims, 3 Drawing Figures

ARC PLASMA GENERATOR AND A PLASMA ARC APPARATUS FOR TREATING THE SURFACES OF WORK-PIECES, INCORPORATING THE SAME ARC PLASMA GENERATOR

BACKGROUND OF THE INVENTION

1. Field of the Invention

The present invention relates to plasma engineering and more particularly it comprehends an arc plasma generator and a plasma arc apparatus for treating the surfaces of work-pieces incorporating the same arc plasma generator.

The invention may prove most advantageous in surfacing, cleaning and etching metal surfaces in vacuum. Specifically, vacuum condensation of the plasma of metals is used to produce antifriction, corrosion-resistant, abrasion-resistant, heat-resistant, superconducting, optical, and other coatings.

2. Description of the Prior Art

Heretofore attempts to treat the metal surfaces having the roughness height from 0.025 to 0.5 $\mu$m by plasma streams produced by the arc plasma generators have failed to retain the roughness number of the surfaces. This is due to the presence of an appreciable number of macroparticles—droplets and solid fragments of the cathode material—in the plasma stream generated by the cathode spot. Apart from worsening the surface finish of the coatings applied by the plasma technique the macroparticles give rise to punctures and build-up portions in the condensates to thereby degrade mechanical, electrical, optical and other properties of the coatings and in practice the expected advantages of applying various coatings are not gained in full (resistance to wear, superior antifriction and corrosion-resistant properties, etc.).

Known in the art is an arc plasma generator disclosed in U.S. Pat. No. 3,625,848. This generator comprises a consumable cathode arranged inside the anode in axial alignment therewith, a means for exciting an arc between the cathode and the anode (ignition means), and a power unit for maintaining the arc electrically connected to the anode and the cathode. The ignition means initiates an arc discharge between the cathode and the anode. The cathode generates a plasma comprising atoms and ions of the cathode material. As has already been stated the plasma stream contains an appreciable number of macroparticles—droplets and solid fragments of the cathode material—which are undesirable since they impair the quality of the coatings.

The macroparticles in the plasma stream are the result of a local and the general superheating of the active surface of the cathode by such a powerful and concentrated thermal source as the cathode spot is (the spot's temperature is several thousand degrees, current density is as great as from about $10^6$ to about $10^7$ A/cm$^2$).

Known in the art is also an arc plasma generator (A. S. Gilmour, Jr., D. L. Lockwood, "Pulsed Metallic-Plasma Generators", PROCEEDINGS OF THE IEEE, Vol. 60, No. 8, August, 1972, pages 977–991) comprising a consumable cathode arranged coaxially with a cylindrical anode, an igniting electrode for initiating an arc between the cathode and the anode connected to an igniting pulse generator, and a power unit for maintaining the arc. The arc plasma generator further comprises a focusing solenoid arranged on the anode.

The arc plasma generator is put into operation by applying a firing pulse to the igniting electrode with a frequency of the order of a few tens of Hertz. The plasma stream is generated at the same frequency as soon as a pulsed arc discharge between the anode and the cathode is excited. The macroparticles in the metallic plasma present a problem with this arc plasma generator. The direction of the velocity vector of the charged components of the stream can be varied by turning the axis of the focusing solenoid through an angle with respect to the axis of the system. In this case a number of macroparticles are removed from the plasma stream as a result of a certain separation of the streams of macroparticles and charged components (ions and electrons) in space. However, the prior art generator does not exclude all the macroparticles from reaching the generator outlet and, consequently, from hitting a substrate since the range of turning the focusing solenoid (15° and up) makes the system transparent from the cathode to the generator outlet for the macroparticles rushing in the same direction.

SUMMARY OF THE INVENTION

A general object of the invention is to provide an arc plasma generator and a plasma arc apparatus for treating the surfaces of work-pieces, incorporating the same arc plasma generator wherein the electromagnetic system is so constructed that by separating in space the components of the plasma stream in a magnetic field an effective removal of macroparticles from the plasma stream is achieved.

Other objects and advantages will be apparent from the detailed description and drawings.

These and other objects of the invention are accomplished by an arc plasma generator comprising a consumable cathode, a cylindrical anode, and a focusing solenoid both arranged coaxially with the consumable cathode, and a power unit for maintaining the arc electrically connected to the consumable cathode and the anode, wherein according to the invention there is a tubular plasma guide connected to an end face of the anode as well as an electromagnet arranged in the tubular plasma guide on the axis thereof and enclosed in a housing made of a nonmagnetic material and having a cross-sectional area sufficient to conceal the cathode from the viewer's sight, looking in the direction of the cathode through the plasma guide, whereas the focusing solenoid is arranged on the tubular plasma guide and is connected in opposition with the coil of the electromagnet.

In such an arrangement the macroparticles fly apart from the end face of the cathode to strike against the walls of the housing of the electromagnet or those of the plasma guide and will never reach the outlet of the generator. The charged components of the plasma stream (ions and electrons) follow the path along the lines of force of the magnetic field induced by the focusing solenoid and the electromagnet, both being connected in opposition to each other, to fly round the electromagnet and easily reach the outlet of the generator. Therefore the outlet plasma is completely free of any macroparticles and can be used, by using such a generator, for treating the surfaces of work-pieces (to apply coatings, to practice a plasma cleaning and ionic etching) without aggravating their surface finish of roughness height not exceeding 0.025 to 0.05 $\mu$m.

It is preferred to insulate the plasma guide from the anode by means of an insulating liner, which feature makes for an increase in the efficiency of plasma stream passing through the plasma guide.

Charged particles are known to follow the magnetic lines of force only when the Larmor radius of the particle is small as compared with the system dimensions. The ions of the majority of metals emitted from the cathode spot in a vacuum have the energy of some tens of electron volts. Therefore these ions can pass through the generator of the invention having a gap of 10 cm between the plasma guide and the housing of the electromagnet only when the magnetic field strength is several kilo-oersteds. Normally such magnetic fields are difficult to induce. However, when the magnetic system is filled with a vacuum plasma this difficulty is removed since passing of the ion component through the generator of the invention in this case is possible with a substantially lower magnetizing force, which is only sufficient to magnetize the ions of the plasma. In this case the electron conduction in the plasma, while being retained along the magnetic lines of force, is sharply decreased laterally. The electric field passes through the plasma. The electric field in the system is induced by electron potentials when the electrons are crossed by magnetic lines of force. As this takes place the magnetic lines of force acquire the potential of the electrodes or of the walls of the system which they cross. Thus, when the plasma guide is at positive potential relative the cathode there is an electric field induced in the plasma flow and directed to its axis. This field provides for constriction (focusing) of the plasma flow to decrease positive-ion loss on the walls of the plasma guide and to increase the number of ions at the outlet, i.e., the ions that have passed the annular gap between the plasma guide and the electromagnet. With a dielectric liner between the plasma guide and the anode due to high-velocity ion bombardment the plasma guide acquires a higher potential than does the anode. The electric field near the walls of the plasma guide becomes stronger and the plasma flow along the plasma guide becomes more effective.

In order to avoid passage of macroparticles that rebound from the walls of the plasma guide to the outlet thereof it is advisable that the inner surface of the tubular plasma guide be provided with ribs extending at an angle to an expected flow of plasma.

It is desirable to construct the electromagnet arranged in the plasma guide so that it has an axially streamlined form and the housing has a similar form. This facilitates entry of the plasma flow into an annular gap between the plasma guide and the electromagnet and, consequently, increases the flow of plasma at the outlet of the generator.

A preferred form of the housing and inner solenoid is that of a cone or two cones abutting each other on their bases.

It is also desirable that the number of turns per unit length of the focusing solenoid on the tubular plasma guide behind the electromagnet in the direction of an expected flow of plasma be greater than on the remaining portion of the plasma guide. This enables focusing of the outcoming plasma flow, results in higher density and, consequently, makes for an increase in the rate of applying coatings.

To the accomplishment of the foregoing and related ends the invention also consists in the provision of a plasma arc apparatus for treating the surfaces of work-pieces, comprising an arc plasma generator and an assembly for holding the work-piece to be treated, wherein according to the invention the arc plasma generator is constructed according to any one of the above claims, the assembly for holding the work-piece is a cover fixed on an unsupported end face of the plasma guide, made of a nonmagnetic material and having an opening for holding the work-piece to be treated, and a disk coil attached to the cover and connected in an aiding manner with the focusing solenoid.

As used herein the term "disk coil" means a coil whose radial dimension is greater than the longitudinal (axial) dimension. The work-piece is to be held on the axis of the generator between the cover and the housing of the electromagnet. Magnetic lines of force, in this case, make sharp bends before the cover to approach the generator axis that is why the plasma flow is also directed toward the axis of the generator following its passage through the annular gap between the plasma guide and the housing of the electromagnet to thereby strike the side surfaces of the work-piece. This obviates the need to axially rotate the work-piece, which technique provides for a considerable simplification of the generator construction taking into account a forced cooling of the work-piece and applying a high current to it as it is subjected to ionic cleaning and surfacing. Since the work-piece is stationary taking temperature is also simplified as the work-piece is being subjected to surfacing.

BRIEF DESCRIPTION OF THE DRAWINGS

The invention will be described further, by way of example, with reference to the accompanying drawings, of which.

DESCRIPTION OF THE PREFERRED EMBODIMENT

Figure 1:
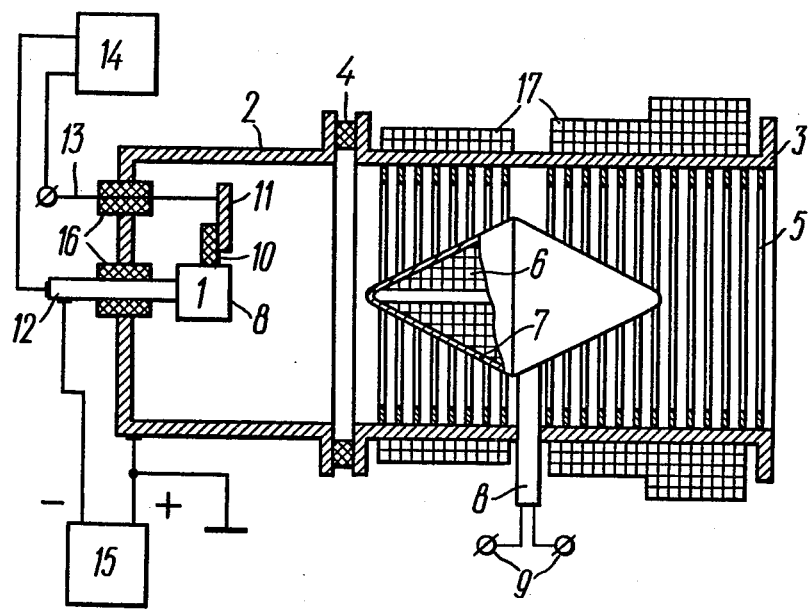
FIG. 1 is a diagrammatical view of an arc plasma generator of the invention shown in an axial section.

Referring to FIG. 1 of the accompanying drawings, an arc plasma generator comprises a consumable cathode 1 having the form of a cylinder with a 60 mm diameter, the dimensions being indicated for purposes of illustration only, and made of a plasma forming material, for example, titan of Grade BT-1, a cylindrical anode 2, which may have the form of a cup with a centrally disposed opening in its bottom for axially mounting the cathode 1 inside the anode 2 (the anode is 200 mm long and of 260 mm in diameter).

The unsupported end face of the anode 2 carries a tubular plasma guide 3 attached thereto, having a 360 mm length and a 260 mm diameter, and made of a nonmagnetic steel.

To make the flow of plasma through the plasma guide 3 more effective an insulating liner 4 is placed between the plasma guide 3 and the anode 2 (the liner is made, e.g. of an acrylic plastic). In this case due to a bombardment of the plasma guide by the highest-velocity ions the plasma guide acquires a higher potential than does the anode. The electric field near the walls of the plasma guide becomes stronger and the plasma flow along the plasma guide becomes more effective.

It is desirable that the inner surface of the plasma guide 3 be provided with ribs 5 extending at an angle to an expected flow of plasma. This makes it possible to avoid passage of macroparticles that rebound from the walls of the plasma guide 3 to the outlet thereof. The most acceptable are the ribs made in the form of rings arranged one after another in parallel planes which are perpendicular to the axis of the plasma guide 3.

Within the plasma guide 3 and axially with it there is arranged an electromagnet 6 which is enclosed in a housing 7 made of a nonmagnetic steel.

Figure 2:
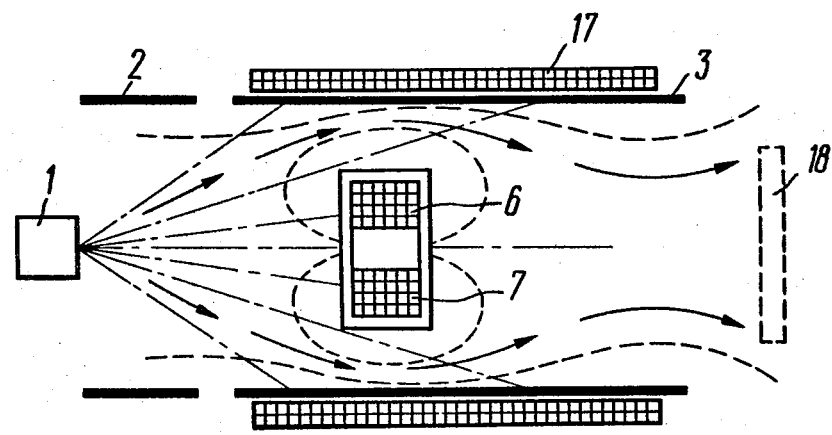
FIG. 2 is a diagram showing fundamentals of separation of the components in a plasma flow as it takes place in the generator of the invention.

The electromagnet 6 and the housing 7 may have a cylindrical form as in FIG. 2, but a streamlined form, for example conical, is preferred (not shown), it may well be composed of two cones (FIG. 1) abutting each other on their bases (the base diameter is 100 mm and the height of each cone is 180 mm). Tests have shown that such form of the electromagnet facilitates entry of the plasma flow into an annular gap between the plasma guide 3 and the electromagnet 6 and, consequently, increases the flow of plasma at the outlet of the generator.

A distance from the end face at the outlet of the plasma guide 3 to the center of the housing 7 is 175 mm. With this specific construction and with the dimensions specified in the plasma guide 3, the housing 7, the cathode 1 and their relative position the housing 7 has a cross-sectional area sufficient to conceal the cathode from the viewer's sight, looking in the direction of the cathode through the plasma guide 3.

The housing 7 is held in position by means of a hollow prop 8 through which electric current is supplied to the coil of the electromagnet 6 via leads 9.

The cathode 1, the anode 2, the plasma guide 3, and the electromagnet 6 are water cooled (the cooling system not shown).

An ignition electrode 11 having the form of a rod, which may be made of molybdenum, abuts the side surface of the cathode 1 through a ceramic connecting strip 10.

Reference numerals 12 and 13 in FIG. 1 designate leads for supplying ignition pulses to the spark gap between the cathode 1 and the ignition electrode 11 from an ignition pulse generator 14.

It is to be appreciated that the arc between the anode and the cathode can be ignited by any conventional means other than that specified. A power unit 15 for maintaining the arc has one of its terminals connected to the consumable cathode 1, and the other one to the anode 2. The leads 12, 13 are passed into the anode 2 through openings in the bottom of the anode 2 and through vacuum-tight dielectric seals 16.

The plasma guide 3 is encompassed by a focusing solenoid 17. It is desirable herewith that the number of turns per unit length of the focusing solenoid 17 on the tubular plasma guide 3 behind the electromagnet 6 be greater than on the remaining portion thereof. This enables the most effective focusing of the outcoming plasma flow, results in higher density and, consequently, makes for an increase in the rate of applying coatings if the generator is used for surfacing work-pieces.

Figure 3:
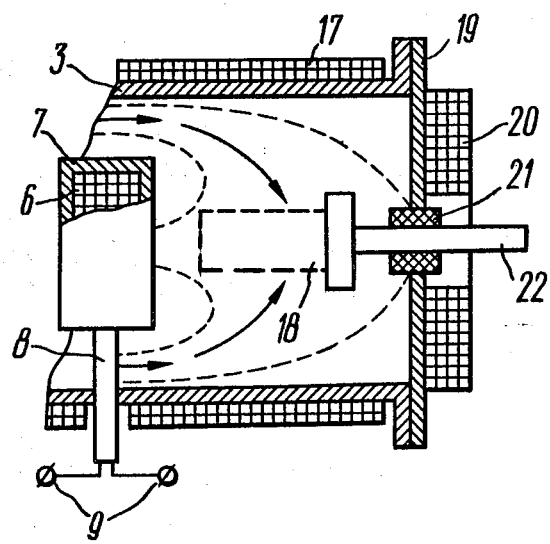
FIG. 3 is a diagrammatical view, in longitudinal section, of a portion of a plasma arc apparatus for treating the surfaces of work-pieces, incorporating the arc plasma generator of the invention.

Reference numeral 18 designates a work-piece to be treated (FIGS. 2 and 3). FIG. 3 shows a plasma arc apparatus for treating the surfaces of work-pieces, comprising the above-described arc plasma generator and an assembly for holding the work-piece to be treated in the form of a cover 19 made of a nonmagnetic steel and attached to the end of the plasma guide 3. The cover has on its outer side a disk coil 20 of a 260 mm diameter and 60 mm thick, which is connected in an aiding manner with the focusing solenoid. In this case a base carrier 22 is received in the plasma guide 3 through the central opening 19 and an insulator 21.

In operation, power sources (not shown) for feeding the focusing solenoid 17 and the electromagnet 6 are switched on and an electric field is induced to have the lines of force pattern as shown by dotted lines in FIG. 2.

The power unit 15 and the pulse generator 14 are also switched on. With a high-voltage ignition pulse supplied to the ignition electrode 11 a spark discharge appears in the gap between the electrode 11 and the cathode 1 over the ceramic connecting strip 10. The spark discharge initiates an arc discharge between the cathode 1 and the anode 2 and a cathode spot appears on the effective surface 23 of the cathode 1, which cathode spot generates a flow of plasma of the material of the cathode 1. The ions and the electrons contained in the plasma flow follow the magnetic lines of force past the housing 7 of the electromagnet 6 and through the outlet portion of the plasma guide 3 reach the surface of the work-piece 18. Arrows in FIG. 2 show the direction of the charged components of the plasma flow (ions and electrons).

Neutral vapor and the macroparticles follow the straightline path (dash-and-dot lines in FIG. 2) and adhere to the surfaces of the plasma guide 3 and the housing 7. Therefore at the outlet of the generator and, consequently, close to the surface of the work 18 of the plasma flow is free of the macroparticles.

In the case of treating the outer surfaces of the bodies of revolution the disk coil 20 deflects the magnetic lines of force toward the work surface (dotted lines in FIG. 3). That is why the ionized component of the plasma flow is also deflected toward the system axis and reaches the work surface. The macroparticles are screened from passage onto the work surface by the housing 7.

Though the invention has been described herein by way of preferred embodiments thereof other forms are possible within the scope of the appended claims.

What is claimed is:

1. An arc plasma generator comprising:
    a consumable cathode having the form of a cylinder and made of a plasma forming material;
    an anode having the form of a cylinder of a greater diameter than that of the cathode, arranged coaxially with said consumable cathode and electrically connected thereto;
    a power unit for maintaining an arc, forming said electrical connection between said consumable cathode and said anode and having therefore at least two terminals, one of which being connected to said consumable cathode and the other to the anode,
    a tubular plasma guide connected with one of its end faces to an end face of said anode,
    an electromagnet arranged in said tubular plasma guide and coaxially therewith,
    a housing for said electromagnet made of a non-magnetic material, enclosing the electromagnet and having a cross-sectional area that any imagined straight line projected from a working end face the consumable cathode through an outlet of the plasma guide, would cross at least one of the housing of the electromagnet and the plasma guide, and a focusing solenoid disposed about said tubular plasma guide and connected in opposition with the coil of the electromagnet.

2. An arc plasma generator as set forth in claim 1 wherein an insulating liner is placed between said tubular plasma guide and said anode.

3. An arc plasma generator as set forth in claim 1 wherein the inner surface of said tubular plasma guide is provided with ribs extending at an angle to an expected flow of plasma.

4. An arc plasma generator as set forth in claim 1 wherein said electromagnet has the form of a cone whose vertex is facing said consumable cathode.

5. An arc plasma generator as set forth in claim 1 wherein said electromagnet has the form of two cones abutting each other on their bases.

6. An arc plasma generator as set forth in claim 1 wherein the number of turns per unit length of said focusing solenoid on said tubular plasma guide behind said electromagnet in the direction of an expected flow of plasma is greater than on the remaining portion thereof.

7. A plasma arc apparatus for treating the surfaces of work-pieces, comprising an arc plasma generator of claim 1, an assembly for holding the work-piece to be treated, constructed as a cover fixed on an outlet end face of said plasma guide, made of a nonmagnetic material and having an opening for holding the work-piece to be treated, and a disk coil attached to said cover and connected in an aiding manner with the focusing solenoid.

* * * * *